United States Patent [19]

Zejda

[11] Patent Number: 5,354,380
[45] Date of Patent: Oct. 11, 1994

[54] APPARATUS FOR THE INSERTION AND REMOVAL OF A MASK THROUGH THE AIRLOCK OF A VACUUM COATING APPARATUS

[75] Inventor: Jaroslav Zejda, Rodenbach, Fed. Rep. of Germany

[73] Assignee: Leybold Aktiengesellschaft, Hanau, Fed. Rep. of Germany

[21] Appl. No.: 163,855

[22] Filed: Dec. 7, 1993

[30] Foreign Application Priority Data

Feb. 2, 1993 [DE] Fed. Rep. of Germany ....... 4302794

[51] Int. Cl.⁵ .............................................. C23C 14/00
[52] U.S. Cl. .................................. 118/719; 118/721; 414/217; 204/298.11; 204/298.25; 204/298.35
[58] Field of Search ................. 118/719, 721; 414/217; 204/298.11, 298.25, 298.35

[56] References Cited

U.S. PATENT DOCUMENTS 4,943,363 7/1990 Zejda .............................. 204/298.15

*Primary Examiner*—Richard Bueker
*Attorney, Agent, or Firm*—Felfe & Lynch

[57] ABSTRACT

A plunger (14) is displaceably mounted in a vacuum chamber (42) and movable on a first linear path into the plane of substrate (20), for the mounting and for the transport of the mask (15) provided with a bore (32) receiving the plunger (14). A slide (41) having a forked extremity is movable from an airlock chamber (39) transverse to the first linear path to engage an annular flange of the mask (15). In a return movement the mask is transported into the removal airlock chamber (39) from which the mask is then removable by means of a removal plunger (48).

4 Claims, 1 Drawing Sheet

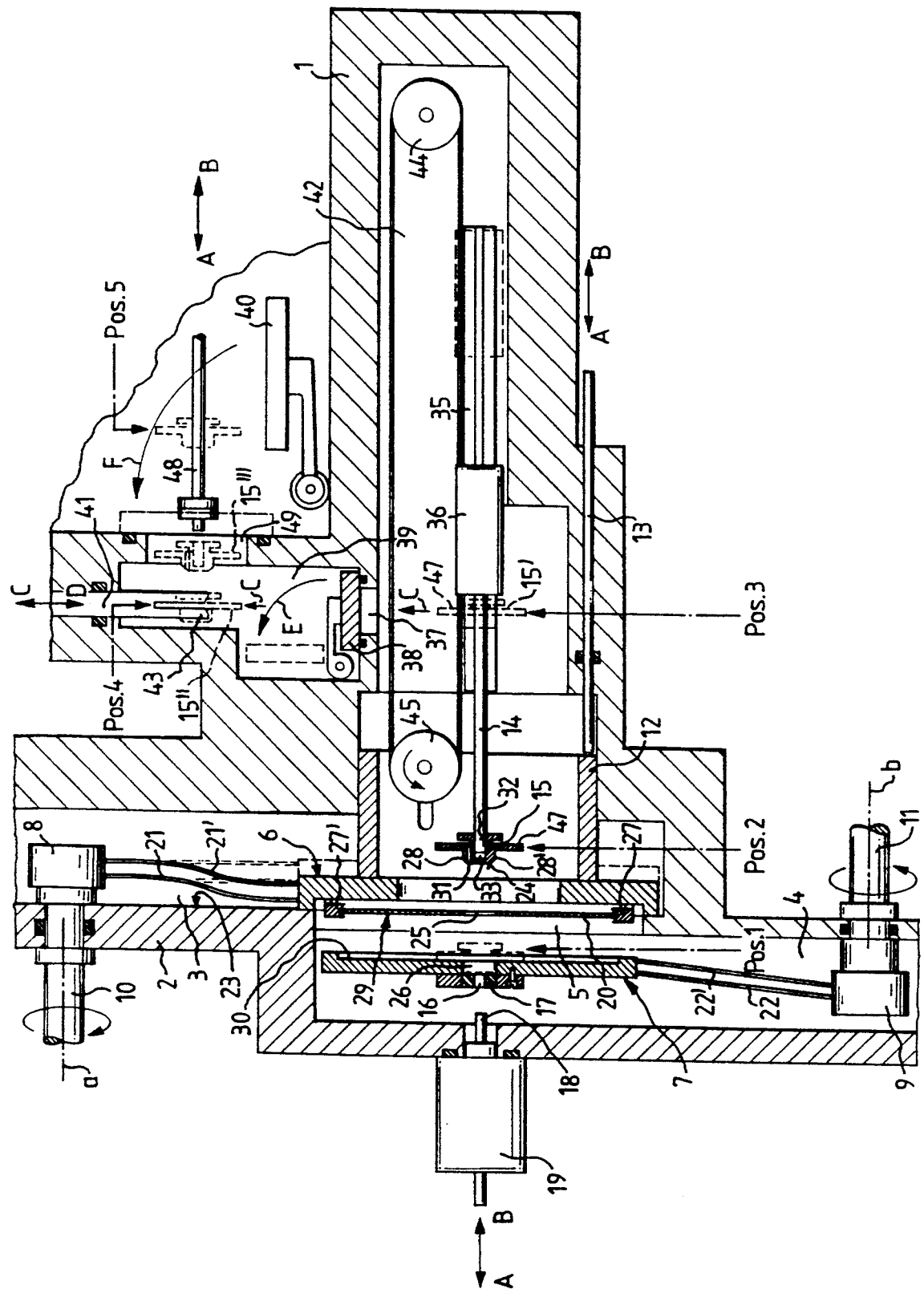

APPARATUS FOR THE INSERTION AND REMOVAL OF A MASK THROUGH THE AIRLOCK OF A VACUUM COATING APPARATUS

BACKGROUND OF THE INVENTION

The invention relates to an apparatus for the insertion and/or removal of a mask for a preferably flat, circular substrate through the airlock of the chamber of a vacuum coating apparatus with a plunger displaceably mounted in a first airlock chamber and movable into the plane of the substrate, for the mounting and for the transport of the mask provided with a receiving bore.

It is known to partially cover disk-like substrates, such as CD-ROMs or magneto-optical discs, with templates or to provide them with masks before coating them in vacuum coating apparatus, so that the marginal zones or central portions of the substrates will remain free of a coating. Such cover templets or masks are usually applied to the substrates before the coating process, i.e., outside of the vacuum area, so that the substrates together with the masks fastened to them can enter the processing chamber of the coating apparatus through an airlock or leave it through the airlock after the coating process. This kind of masking has the disadvantage that the masks are rapidly "used up," since incrustation forms their external surfaces, which can considerably interfere with the coating process.

SUMMARY OF THE INVENTION

The present invention is therefore addressed to an apparatus which permits the placement and removal of the masks on the substrates within the vacuum area of the coating apparatus, and especially make it possible to let the masks in and out of the apparatus through airlocks after a series of coating cycles.

According to the invention, a plunger is held and guided transversely through the plane of the substrate and carries a mask which cooperates with a slide which can move transversely of the direction of the movement of the plunger. The slide has a forked head which receives an annular flange of the mask and grips it, for which purpose the slide is brought from its starting position in a second air-lock chamber in an advancing movement up to the transport path of the plunger. The mask is transported by the slide in a return movement to the second removal lock chamber, from which then, after the closing of a valve separating the two chambers from one another, the mask can be transported out by means of an additional plunger.

BRIEF DESCRIPTION OF THE DRAWING

The sole FIGURE is a section view showing the vacuum chamber, the air-lock chamber, and the transfer apparatus.

DETAILED DESCRIPTION OF THE PREFERRED EMBODIMENT

The device includes an air-tight housing 1, 2, which has a first transport chamber 3 and a second transport chamber 4 disposed in planes parallel to one another, each of the two chambers 3 and 4 being in the form of cylindrical cavities and the longitudinal axes of the two cylindrical chambers 3 and 4 being arranged parallel to one another but offset from one another. In the chamber 3 and in the adjacent chamber 4, respective first and second carrier plates 6 and 7 are disposed, each of them being affixed by respective spring arms 21, 22 to hubs 8 and 9 which are mounted on drive shafts 10 and 11 which can be driven by motors not represented in the drawing. While the carrier plates 7 revolve about axis b in chamber 4, to move the substrates 20 on a second circular path from one treatment station to the next treatment station, the carrier plates 6 move the substrates on a first circular path from an insertion and removal lock station (not represented) to the transfer station shown and vice versa (from the transfer station to the insertion and removal lock station). In the area of an opening 5 connecting the two chambers 3 and 4 to one another, a pressure ring 12 is guided in the housing 1 to permit movement in the direction of arrow A–B by displacement of the plunger 13. A first plunger 14 is furthermore provided on a sliding block 36 which can be motor-driven in the direction of the arrow A–B and which carries a mask 15, the longitudinal axis of the plunger 14 being aligned with the central bore 16 of a ring magnet 17 when the carrier plate 7 is in the position shown in the drawing. Also aligned with the plunger 14 is a second plunger 18 which is mounted in a motor unit 19 which is disposed on the housing 2 opposite the sliding block 36 and also permits movement of the plunger 18 in the direction A–B.

In the drawing the positions of the carrier plates 6 and 7 are represented such that the transfer of a substrate 20 from the first carrier plate 6 to the second carrier plate 7 can be performed. Such carrier plates and their driving units are further described in full detail and represented in U.S. Pat. No. 4,943,363.

For the purpose of transferring the substrate 20 to the carrier plate 7, first the carrier plate 6 is driven by pressure ring 12 in direction A from a middle position indicated in broken lines, against the force of the spring arms 21 and 21', to the inside wall 23, while at the same time the driving of shaft 10 is blocked. Then the plunger 14 moves leftward in direction A to the carrier plate 6 which is blocked in the position represented, until the head 24 of the mask 15 enters the center opening 25 of the substrate 20, carrying substrate 20 until the head 24 engages the magnet 17 (Pos. 1) and is held by the latter in this position in the bore 26. To permit the substrate 20 to be carried from the represented position to the position on carrier plate 7 (Pos. 1) represented in broken lines, the holding jaws 27, 27' yields resiliently so that they release the substrate 20. The mask 15 is now so centered in bore 26 and held on the magnet 17 that the plunger 14 moves back in direction B to its starting position (Pos. 2), while at the same time the carrier plate 7 can be revolved about the axis b in order to transport the substrate 20 to the first treatment station. As the carrier plate 7 continues to move or swing, an adjacent carrier plate is moved into the position in which the represented carrier plate 7 was previously, so that a transfer of the substrate 20 to the carrier plate 6 stopped opposite it can take place. For this purpose the second plunger 18, driven by motor 19, moves in direction B until it strikes against the head of the mask 15, tears this mask away from the magnet 17 on the carrier plate 7, and then transports the mask 15 together with substrate 20 in direction B into the plane of the holding jaws 27, 27'. Since the head 24 of each mask 15 is equipped with holding projections 28, 28', the mask 15 is fixed to the substrate 20 or locked thereon, until any further movement in direction B is prevented by the holding jaws 27, 27', which yield resiliently to receive the substrate. The mask 15 is then moved further on by second plunger 18 until it is firmly seated on the opposite plunger 14 (Pos. 2). The substrate 20 can then be swung by the carrier plate without the mask 15 after a return movement of the pressure ring 12 to the position (not shown) for insertion and removal from the air lock.

For the purpose of the replacement of a mask 15, the plunger 14, which is affixed to a sliding block 36 guided on a rail 35 runs to the right (direction B) until the mask 15 is approximately in the position indicated at 15' in broken lines, just opposite the opening 37 in the housing wall 2 (Pos. 3). This opening can be closed by a first flap valve 38 and permits the mask 15' to be carried into the airlock chamber 39 which in turn can be cut off by a second flap valve 40 from the space surrounding the apparatus. A slide 41 is mounted in the chamber 39 or in its chamber wall for displacement in the directions C–D indicated by the arrow, and its head 43 facing the chamber 42 is forked. The sliding block 36, which is held and guided on the rail 35, is moved by means of a cable passing over wheels 44 and 45, the wheels being driven by motors that are not shown. When the valve 38 is opened the forked head part 43 runs toward the mask 15' in the direction D until the two tines are placed around the annular flange 47 of the mask 15', which is in the position indicated in broken lines (Pos. 3). The sliding block 36 together with the plunger 14 now moves a slight amount further to the right (direction B), so that the mask 15' is held exclusively by the head part 43 and can be moved by the slide 41 in the direction C into the chamber 39 until the mask has reached the position 15" shown in broken lines (Pos. 4). The valve 38 is now turned to its closed position (as shown in the drawing) and the valve 40 opens the chamber 39 to the exterior. The removal plunger 48 moves from the outside through the opening 49 into the chamber 39 until its extremity bearing a magnet has entered into the blind hole in the mask 15". The mask 15" can then be carried out through the opening 49 by means of the plunger 48, and replaced with a new or refurbished mask.

I claim:

1. Apparatus for transporting a substrate into and out of a vacuum chamber, said substrate being of the type comprising a disk having a central hole, said apparatus comprising a vacuum chamber;

a mask having a blind central bore, means for engaging said central hole of said substrate, and an annular flange concentric to said bore;

a first plunger movable on a first linear path in said vacuum chamber, said first plunger having an end which is receivable in said bore as said plunger moves on said path, an airlock chamber adjacent to said vacuum chamber;

first valve means which can be opened to connect said airlock chamber to said vacuum chamber;

slide means movable transversely to said first linear path from said airlock chamber through said first valve means and into said vacuum chamber when said first valve means is opened, said slide means having fork means which receives said annular flange to transfer said mask from said vacuum chamber to said airlock chamber; and second valve means which can be opened to remove said mask from said airlock chamber.

2. Apparatus as in claim 1 further comprising a removal plunger movable into said airlock chamber through said second valve means when said second valve means is opened, said removal plunger having an end which is received in said bore.

3. Apparatus as in claim 1 wherein said vacuum chamber comprises interconnected first and second substrate transport chambers, said apparatus further comprising a first carrier located in said first chamber and being movable on a first circular path about a first axis parallel to said first linear path, said first linear path intersecting said first circular path, said first carrier having means for releasably holding said substrate peripherally, a second carrier located in said second chamber and being movable on a second circular path about a second axis parallel to said first linear path, said first linear path intersecting said second circular path, said second carrier having means for engaging said mask while said mask engages said substrate, whereby, said mask may be moved on said first linear path through said first carrier so that said mask engages said substrate and releases it from said first carrier and so that said mask then engages said second carrier, whereupon said first plunger may be withdrawn so that said substrate with said mask engaged may be moved on said first circular path.

4. Apparatus as in claim 3 further comprising a second plunger movable toward said second carrier on a second linear path which is colinear to said first linear path, said second plunger having an end which cooperates with said means for engaging said mask to release said mask from said second carrier and to move said mask toward said first carrier as said second plunger moves on said second path.

* * * * *